United States Patent
Lee et al.

(10) Patent No.: US 7,470,938 B2
(45) Date of Patent: Dec. 30, 2008

(54) NITRIDE SEMICONDUCTOR LIGHT EMITTING DEVICE

(75) Inventors: Jae Hoon Lee, Kyungki-do (KR); Jeong Wook Lee, Kyungki-do (KR); Hyun Kyung Kim, Kyungki-do (KR); Yong Chun Kim, Kyungki-do (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 377 days.

(21) Appl. No.: 10/983,637

(22) Filed: Nov. 9, 2004

(65) Prior Publication Data
US 2005/0221521 A1 Oct. 6, 2005

(30) Foreign Application Priority Data
Mar. 30, 2004 (KR) .................. 10-2004-0021801

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)
*H01L 29/24* (2006.01)
*H01L 33/00* (2006.01)
*H01L 29/22* (2006.01)
*H01L 21/00* (2006.01)

(52) U.S. Cl. ................... 257/103; 257/13; 257/79; 257/80; 257/81; 257/82; 257/83; 257/84; 257/85; 257/86; 257/87; 257/88; 257/89; 257/90; 257/91; 257/92; 257/93; 257/94; 257/95; 257/96; 257/97; 257/98; 257/99; 257/100; 257/101; 257/102; 257/918; 438/29; 438/30; 438/31; 438/32

(58) Field of Classification Search .............. 257/13, 257/79–103, 918; 438/29–32
See application file for complete search history.

(56) References Cited

U.S. PATENT DOCUMENTS 5,779,924 A * 7/1998 Krames et al. ............... 216/24

(Continued)

FOREIGN PATENT DOCUMENTS

JP 2000-196141 A 7/2000

(Continued)

OTHER PUBLICATIONS

Japanese Patent Office, Office Action mailed Jun. 12, 2007 and English Translation.

*Primary Examiner*—Ida M Soward
(74) *Attorney, Agent, or Firm*—Lowe Hauptman Ham & Berner

(57) ABSTRACT

In a nitride semiconductor light emitting device having patterns formed on the upper and lower surfaces of a substrate from which light is emitted in a flip chip bonding structure, the patterns are capable of changing light inclination at the upper and lower surfaces of the substrate to decrease total reflection at the interfaces, thereby improving light emitting efficiency. The device includes a substrate having upper and lower surfaces on which predetermined patterns are formed such that light can be incident within a critical angle, the substrate allowing a gallium nitride-based semiconductor material to be grown thereon, an n-type nitride semiconductor layer formed on the upper surface of the substrate, an active layer formed on the upper surface of the n-type nitride semiconductor layer such that the n-type nitride semiconductor layer is partially exposed, a p-type nitride semiconductor layer formed on the upper surface of the active layer, a p-electrode formed on the upper surface of the p-type nitride semiconductor layer, and an n-side electrode formed on the partially exposed n-type nitride semiconductor layer.

12 Claims, 11 Drawing Sheets

U.S. PATENT DOCUMENTS

| | | | |
|---|---|---|---|
| 5,847,409 A * | 12/1998 | Nakayama | 257/15 |
| 6,091,083 A * | 7/2000 | Hata et al. | 257/79 |
| 6,426,514 B1 * | 7/2002 | Atanackovic | 257/14 |
| 6,787,435 B2 | 9/2004 | Gibb et al. | 483/507 |
| 6,861,672 B2 * | 3/2005 | Kamiyama et al. | 257/79 |
| 6,870,191 B2 * | 3/2005 | Niki et al. | 257/79 |
| 6,891,201 B2 * | 5/2005 | Tsuda et al. | 257/88 |
| 6,900,457 B2 * | 5/2005 | Toguchi et al. | 257/40 |
| 6,956,245 B2 * | 10/2005 | Senda et al. | 257/94 |
| 7,009,210 B2 * | 3/2006 | Sarathy et al. | 257/98 |
| 7,154,121 B2 * | 12/2006 | Hsieh et al. | 257/79 |
| 2001/0010941 A1 * | 8/2001 | Morita | 438/46 |
| 2002/0004255 A1 * | 1/2002 | Kim | 438/47 |
| 2002/0034835 A1 * | 3/2002 | Chen et al. | 438/29 |
| 2003/0117704 A1 * | 6/2003 | Lippey et al. | 359/443 |
| 2003/0168665 A1 * | 9/2003 | Kim et al. | 257/80 |
| 2003/0178626 A1 * | 9/2003 | Sugiyama et al. | 257/79 |
| 2004/0041157 A1 * | 3/2004 | Watanabe | 257/79 |
| 2004/0104672 A1 * | 6/2004 | Shiang et al. | 313/506 |
| 2004/0227140 A1 * | 11/2004 | Lee et al. | 257/79 |
| 2005/0017257 A1 * | 1/2005 | Green et al. | 257/98 |
| 2007/0121690 A1 * | 5/2007 | Fujii et al. | 372/43.01 |

FOREIGN PATENT DOCUMENTS

| | | |
|---|---|---|
| JP | 2002-289579 A | 10/2002 |
| JP | 2002-368261 | 12/2002 |
| JP | 2002-368261 A | 12/2002 |
| JP | 2003-046124 A | 2/2003 |
| JP | 2003-069075 A | 3/2003 |
| JP | 2003-078162 A | 3/2003 |
| JP | 2003-110136 A | 4/2003 |
| JP | 2003-197961 A | 7/2003 |
| KR | 2003-17462 | 3/2003 |

* cited by examiner

NITRIDE SEMICONDUCTOR LIGHT EMITTING DEVICE

RELATED INVENTION

The present application is based on, and claims priority from, Korean Application Number 2004-21801, filed Mar. 30, 2004, the disclosure of which is incorporated by reference herein in its entirety.

BACKGROUND OF THE INVENTION

1. Field of the Invention

The present invention relates to a nitride semiconductor light emitting device, and more particularly to a nitride semiconductor light emitting device having patterns formed on the upper and lower surfaces of a substrate wherein the patterns are capable of changing light inclination at the upper and lower surfaces of the substrate to decrease total reflection, thereby improving light emitting efficiency. Also, the present invention relates to a method of manufacturing the same.

2. Description of the Related Art

Lately, a nitride semiconductor, such as GaN, has been widely used as a photoelectric material or an essential material for electronic devices by virtue of its excellent physical and chemical properties.

In case of a GaN-based light emitting device, a red light emitting diode has been commercially used since the second half of the 1960's. GaN-based blue and green light emitting diodes have been commercially used since the second half of the 1990's. Also, a white light emitting diode can be formed from a GaN-based compound semiconductor. As the high-efficiency three primary colors (red, blue, and green) and white light emitting diodes have appeared, the application range of the light emitting diode has expanded. For example, the light emitting diodes are widely used in various applications, such as a backlight for keypads and liquid crystal display units, a traffic light, a guiding light for airport runaways, a head light for airplanes or automobiles, and an illuminating light.

Especially, the GaN-based white emitting diode now has a light emitting efficiency of approximately 25 lm/W, which is still less than that of a fluorescent lamp. However, the performance of the GaN-based white emitting diode is being rapidly improved. Consequently, it is expected that the GaN-based white emitting diode will substitute for an incandescent lamp as well as the fluorescent lamp sooner or later.

FIG. 1 shows the basic structure of such a GaN-based semiconductor light emitting device. Referring to FIG. 1, the GaN-based semiconductor light emitting device comprises an n-type nitride semiconductor layer 12 formed on a sapphire substrate 11, an active layer 13, having a multi well structure, formed on the n-type nitride semiconductor layer 12, and a p-type nitride semiconductor layer 14 formed on the active layer 13. The p-type nitride semiconductor layer 14 and the active layer 13 are partially etched such that the upper surface of the n-type nitride semiconductor layer 12 is partially exposed. On the upper surface of the p-type nitride semiconductor layer 14 is formed a p-electrode 15 (hereinafter, referred to as "P-electrode"), and on the exposed upper surface of the n-type nitride semiconductor layer 12 is formed an n-side electrode 16 (hereinafter, referred to as "N-electrode").

The structure shown in FIG. 1 is the basic structure of the GaN-based semiconductor light emitting device. In addition, a buffer layer may be disposed between the n-type nitride semiconductor layer 12 and the substrate 11 for improving lattice latching. Also, a transparent electrode layer (T metal) 16 may be disposed between the p-type nitride semiconductor layer 14 and the P-electrode 15 for forming ohmic contact and improving current injection efficiency.

The above-mentioned light emitting devices, especially the GaN-based white light emitting device, have low light emitting efficiency, which is the greatest problem with the light emitting devices. Generally, light emitting efficiency is determined by efficiency at which light is generated, efficiency at which light is emitted from the light emitting device, and efficiency at which light is amplified by means of a fluorescent substance. The conventional GaN-based white light emitting device has a problem in that the efficiency at which light is emitted from the light emitting device is very low. The major obstacle to emission of light from the light emitting device is internal total reflection. Due to the difference of refractive indices between the respective layers of the light emitting device, the amount of light exiting from the interfaces corresponds to approximately 20% of the total amount of light. Furthermore, the remaining light having not exited from the interfaces moves in the light emitting device, and finally decays into heat. As a result, the amount of heat generated from the light emitting device increases while light emitting efficiency of the light emitting device is low, and therefore the service life of the light emitting device is reduced.

Alternatively, the light emitting device shown in FIG. 1 may be turned upside down such that the light emitting device has a flip-chip bonding structure. Also, the light emitting device may be provided with a rear surface reflecting film such that light generated toward the electrodes 15 and 16 is reflected to the substrate 11. In this case, the light is emitted through the substrate 11. Consequently, it is possible to make the best use of light reduced due to the low transmission efficiency of the P-electrode 15, by which the light emitting efficiency is increased by approximately 40%. However, the problem that the light emitting efficiency is reduced due to the total reflection in the light emitting device has yet to be solved.

SUMMARY OF THE INVENTION

Therefore, the present invention has been made in view of the above problems, and it is an object of the present invention to provide a nitride semiconductor light emitting device having patterns formed on the upper and lower surfaces of a substrate from which light is emitted in a flip chip bonding structure wherein the patterns are capable of changing light inclination at the upper and lower surfaces of the substrate to decrease total reflection at the interfaces, thereby improving light emitting efficiency.

It is another object of the present invention to provide a method of manufacturing the same.

In accordance with one aspect of the present invention, the above and other objects can be accomplished by the provision of a nitride semiconductor light emitting device comprising: a substrate having upper and lower surfaces on which predetermined patterns are formed such that light can be incident within a critical angle, the substrate allowing a gallium nitride-based semiconductor material to be grown thereon; an n-type nitride semiconductor layer formed on the upper surface of the substrate; an active layer formed on the upper surface of the n-type nitride semiconductor layer such that the n-type nitride semiconductor layer is partially exposed; a p-type nitride semiconductor layer formed on the upper surface of the active layer; a p-electrode formed on the upper surface of the p-type nitride semiconductor layer; and an n-side electrode formed on the partially exposed n-type nitride semiconductor layer.

Preferably, the nitride semiconductor light emitting device is a flip chip-type nitride semiconductor light emitting device constructed such that the p-bonding electrode and the n-side electrode are directly bonded to a circuit board and light is emitted through the substrate.

Preferably, the substrate is made of sapphire, SiC, or GaN.

The substrate may have a hemispherical convex pattern formed on a first surface thereof where the n-type nitride semiconductor layer is formed and a hemispherical concave pattern formed on a second surface thereof, the second surface of the substrate being opposite to the first surface of the substrate. The substrate may have a first surface where the n-type nitride semiconductor layer is formed and a hemispherical convex pattern formed on a second surface thereof, the second surface of the substrate being opposite to the first surface of the substrate. Also, the substrate may have a hemispherical convex pattern formed on a first surface thereof where the n-type nitride semiconductor layer is formed and a prism-shaped convex pattern having triangle sections formed on a second surface thereof, the second surface of the substrate being opposite to the first surface of the substrate.

In accordance with another aspect of the present invention, there is provided a method of manufacturing a nitride semiconductor light emitting device, the method comprising the steps of: forming a predetermined pattern on a first surface of a substrate, the substrate also having a second surface; forming a light emitting structure comprising an n-type nitride semiconductor layer, an active layer, and a p-type nitride semiconductor layer on the first surface of the substrate, the n-type nitride semiconductor layer, the active layer, and the p-type nitride semiconductor layer being disposed in sequence on the first surface of the substrate; forming an N-electrode and a P-electrode on the n-type nitride semiconductor layer and the p-type nitride semiconductor layer of the light emitting structure, respectively; grinding the second surface of the substrate; attaching the N-electrode and the P-electrode to a jig substrate to make the substrate level; forming another predetermined pattern on the second surface of the ground substrate; and removing the jig substrate.

Preferably, the patterns formed on the first and second surfaces of the substrate may be hemispherical concave and/or convex patterns.

Also, the pattern formed on the first surface of the substrate may be a hemispherical concave and/or convex pattern, and the pattern formed on the second surface of the substrate may be a prism-shaped convex pattern.

When the patterns are hemispherical convex patterns, the step of forming the patterns on the first and second surfaces of the substrate comprises the sub-steps of: applying a photoresist having a predetermined thickness to the corresponding surface of the substrate; removing the photoresist from the substrate, excluding the photoresist disposed at the positions where a plurality of convex parts of the hemispherical convex pattern are to be formed, to form a photoresist pattern; re-flowing the substrate at a temperature of 100 to 150° C. for approximately 1 to 5 minutes to form the photoresist pattern into hemispherical shapes; and etching the corresponding surface of the substrate by means of inductively coupled plasma reactive ion etching (ICP-RIE) using the hemispherical photoresist as a mask to form a hemispherical convex pattern.

When the patterns are hemispherical concave patterns, the step of forming the patterns on the first and second surfaces of the substrate comprises the sub-steps of: etching the substrate to form a first circular concave pattern having a plurality of concave parts arranged at regular intervals; secondly etching the corresponding surface of the substrate to form a second circular concave pattern having a plurality of concave parts overlapping with the concave parts of the first circular concave pattern, respectively, each of the concave parts of the second circular concave pattern having a second diameter greater than the first diameter of each of concave parts of the first circular concave pattern; and over-etching the first and second concave patterns to form a hemispherical concave pattern.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the accompanying drawings.

Figure 1:
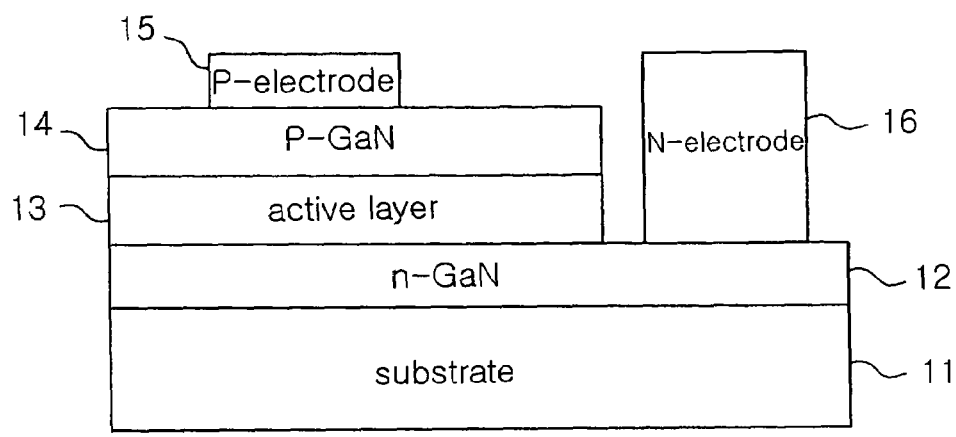
FIG. 1 is a side view, in section, showing a general nitride semiconductor light emitting device.
Figure 2:
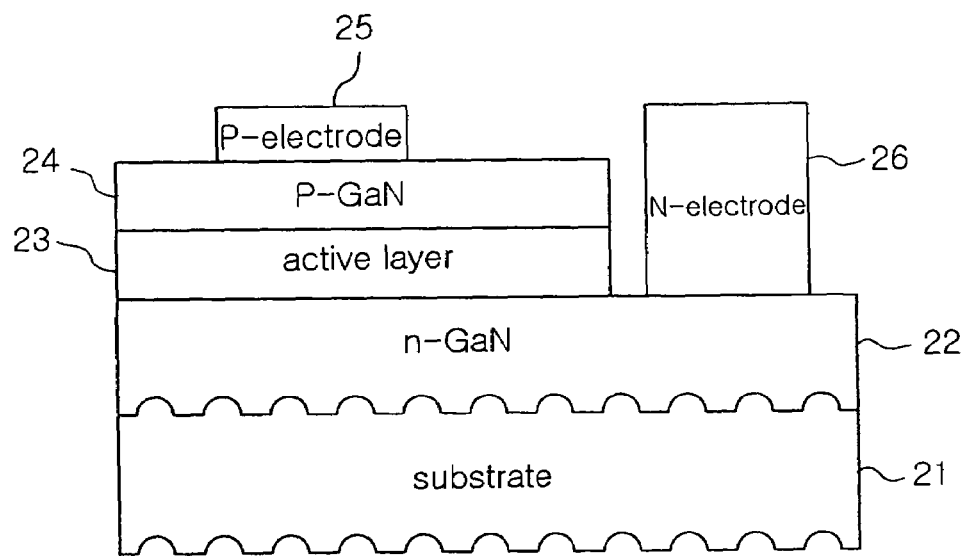
FIG. 2 is a side view, in section, showing a nitride semiconductor light emitting device according to the present invention.

FIG. 2 is a side view, in section, showing the basic structure of a nitride semiconductor light emitting device according to the present invention. The nitride semiconductor light emitting device comprises: a substrate 21 having upper and lower surfaces on which predetermined concave and convex patterns are formed such that light can be incident within a critical angle, the substrate 21 allowing a gallium nitride-based semiconductor material to be grown thereon; an n-type nitride semiconductor layer 22 formed on the upper surface of the substrate 21; an active layer 23 formed on the upper surface of the n-type nitride semiconductor layer 22 such that the n-type nitride semiconductor layer 22 is partially exposed; a p-type nitride semiconductor layer 24 formed on the upper surface of the active layer 23; a p-electrode (P-electrode) 25 formed on the upper surface of the p-type nitride semiconductor layer 24; and an n-side electrode (N-electrode) 26 formed on the partially exposed n-type nitride semiconductor layer 22.

The nitride semiconductor light emitting device according to the present invention provides more preferable effects in the case that the light emitting device is constructed in a flip chip structure where light is emitted through the substrate 21.

Figure 5:
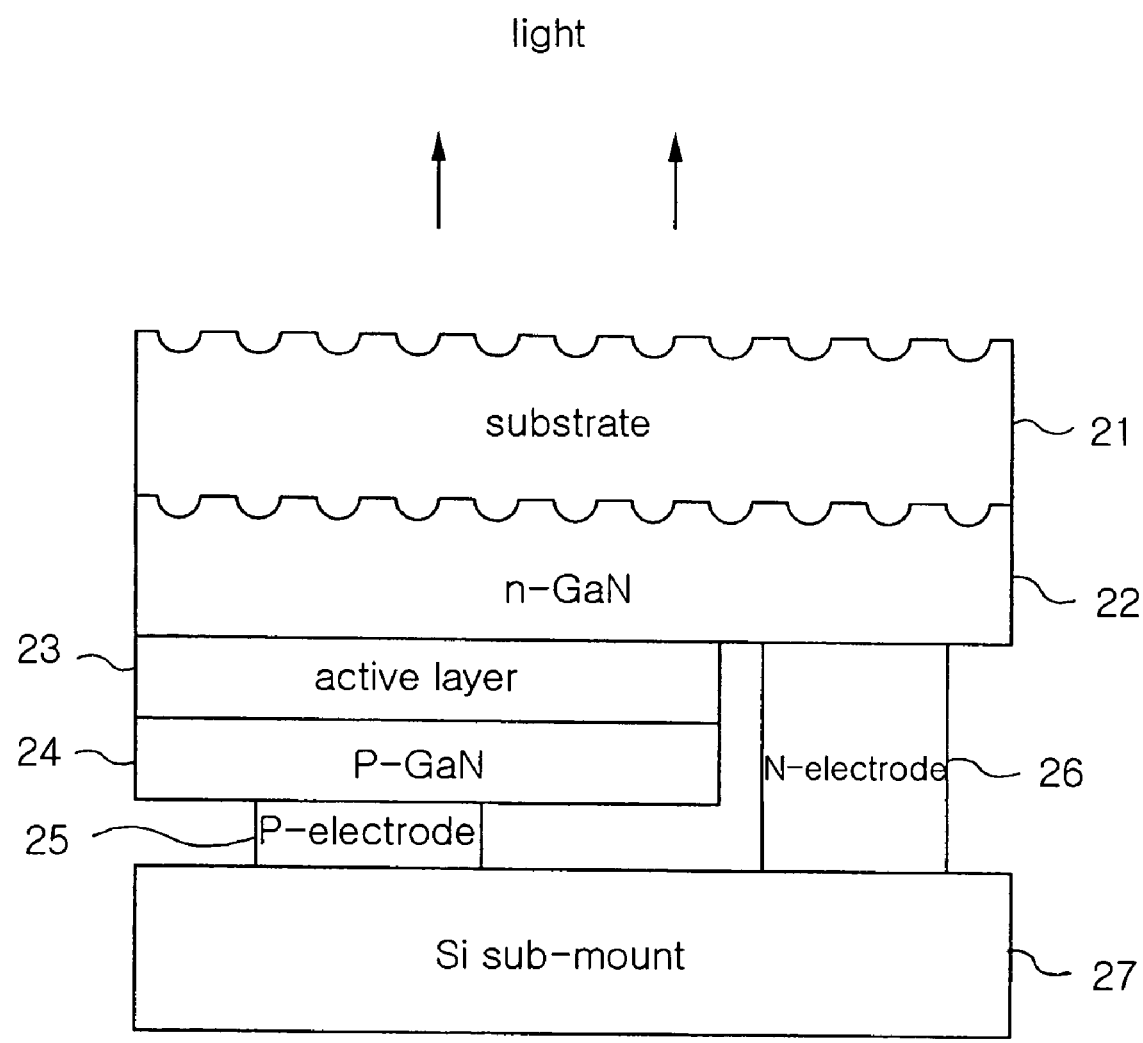
FIG. 5 is a side view, in section, showing the flip chip-bonded nitride semiconductor light emitting device according to the present invention.

FIG. 5 is a side view, in section, showing the flip chip-bonded nitride semiconductor light emitting device according to the present invention. The P-electrode 25 and the N-electrode 26 of the nitride semiconductor light emitting device shown in FIG. 2 are bonded on a sub-mount substrate 27 having a circuit pattern formed thereon. When an electric signal is transmitted to the P-electrode 25 and the N-electrode 26 through external terminals of the sub-mount substrate 27 in this structure, light generated from the nitride semiconductor layer passes though the substrate, and is then discharged into the air.

The substrate 21 is made of sapphire, SiC, or GaN. The sapphire substrate has a refractive index of 1.78, which is greater than that of air. The refractive index of air is 1. Also, the refractive index of the n-type nitride semiconductor layer 22 is approximately 2.54, which is greater that that of the sapphire substrate 21. In the flip chip-bonded structure, the light generated from the nitride semiconductor light emitting device successively passes through the n-type nitride semiconductor layer 22, the substrate 21, and the air.

When light is incident from a material having a high refractive index to another material having a low refractive index, the light is totally reflected at the interfaces if the incident angle is above a predetermined angle. The minimum value of the incident angle where such total reflection occurs is referred to as the critical angle. The critical angle is determined on the basis of the refractive indices of the two materials. When the critical angle is $\alpha_0$, and the refractive indices of the two materials are $n_1$ and $n_2$, $\sin \alpha_0 = n_2/n_1$.

Consequently, when light generated from the nitride semiconductor layer is incident from the n-type nitride semiconductor layer 23 to the substrate 21 or from the substrate 21 to the air, light incident at above the critical angles of the respective interfaces is totally reflected, since light is incident from a material having high refractive index to a material having low refractive index.

For this reason, the substrate 21 of the nitride semiconductor light emitting device according to the present invention shown in FIGS. 2 and 5 is provided at the upper surface, which contacts the n-type nitride semiconductor layer 22, and the lower surface thereof with predetermined concave and convex patterns that change light inclination. As a result, the incident angle of most of the light is reduced below the critical angle.

For convenience of description, one surface of the substrate 21, which contacts the n-type nitride semiconductor layer 22, is referred to as a first surface, and the other surface of the substrate 21, which contacts the air, is referred to as a second surface.

In the nitride semiconductor light emitting device shown in FIG. 2, the first surface of the substrate 21 has a hemispherical convex pattern, and the second surface of the substrate 21, which is opposite to the first surface of the substrate 21, has a hemispherical concave pattern. The incident angle of light is changed at the concave and convex interfaces, and thus total reflection due to the refractive index is decreased. Consequently, the remaining light having not exited from the first and second surfaces of the substrate 21, i.e., the light moving in the light emitting device is prevented from being transformed into heat. As a result, the amount of heat generated is reduced.

Figure 3:
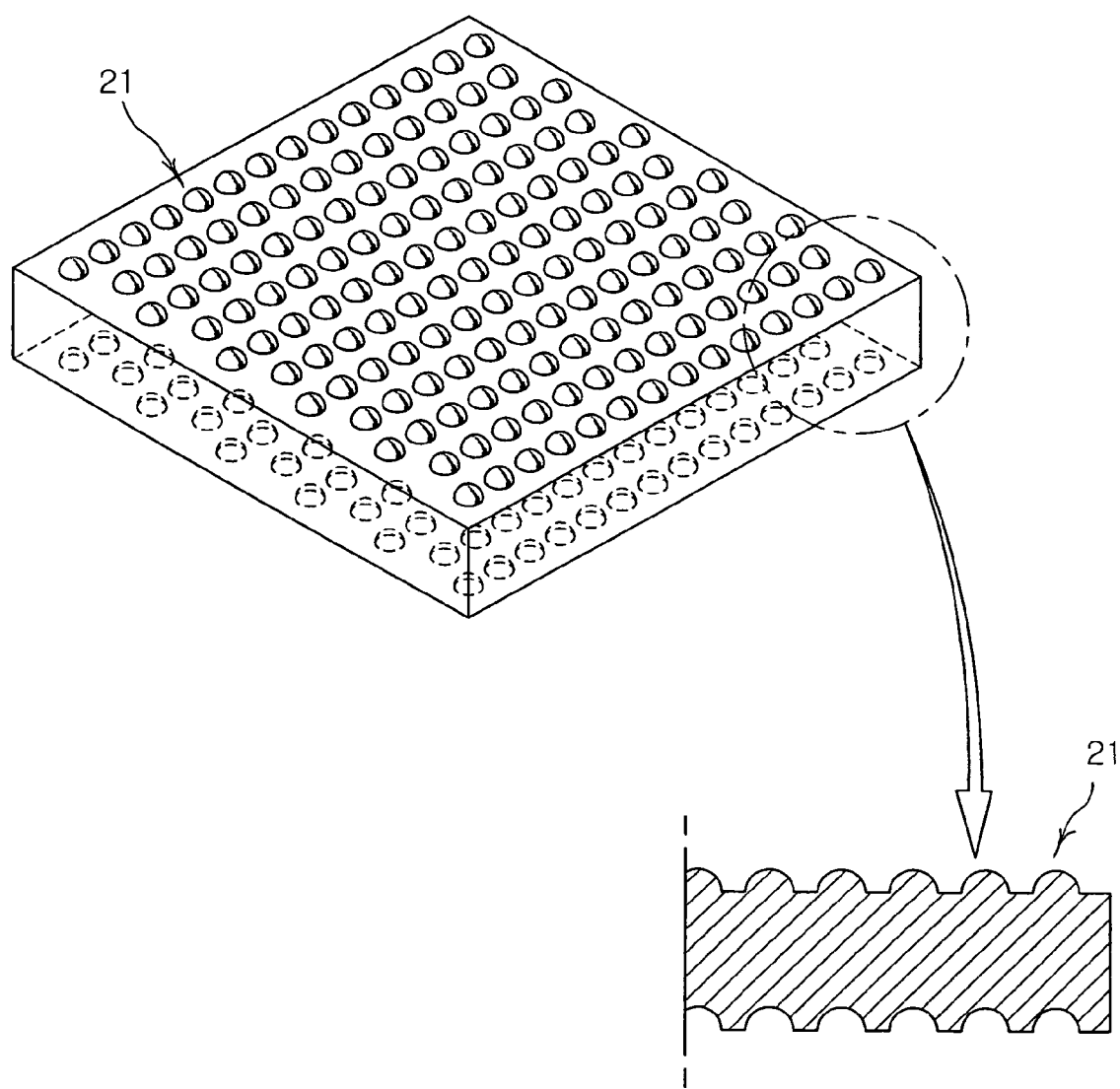
FIG. 3 is a detailed view illustrating the structure of a substrate applicable to the nitride semiconductor light emitting device according to the present invention shown in FIG. 2.

FIG. 3 shows, in detail, the structure of the substrate 21 shown in FIG. 2. As shown in FIG. 3, the hemispherical convex pattern is formed on the first surface of the substrate 21, and the hemispherical concave pattern is formed on the second surface of the substrate 21. The hemispherical convex pattern has a plurality of convex parts, which are uniformly arranged at regular intervals. The hemispherical concave pattern has a plurality of concave parts, which are uniformly arranged at regular intervals. Preferably, the convex and concave parts of the hemispherical convex and concave patterns, which are formed on the first and second surfaces of the substrate 21, respectively, each have a height of approximately 1 to 5 μm, and a diameter of approximately 3 to 5 μm. Also preferably, the distance between the respective convex or concave parts of the hemispherical convex or concave patterns is approximately 2 to 5 μm.

Figure 4A:
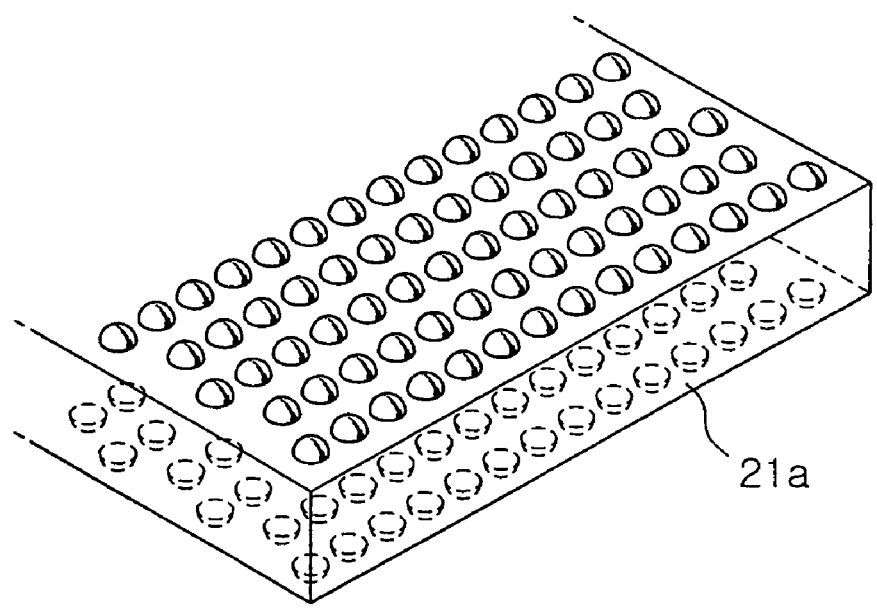
FIGS. 4A and 4B are views respectively illustrating the structures of other substrates applicable to the nitride semiconductor light emitting device according to the present invention shown in FIG. 2.
Figure 4B:
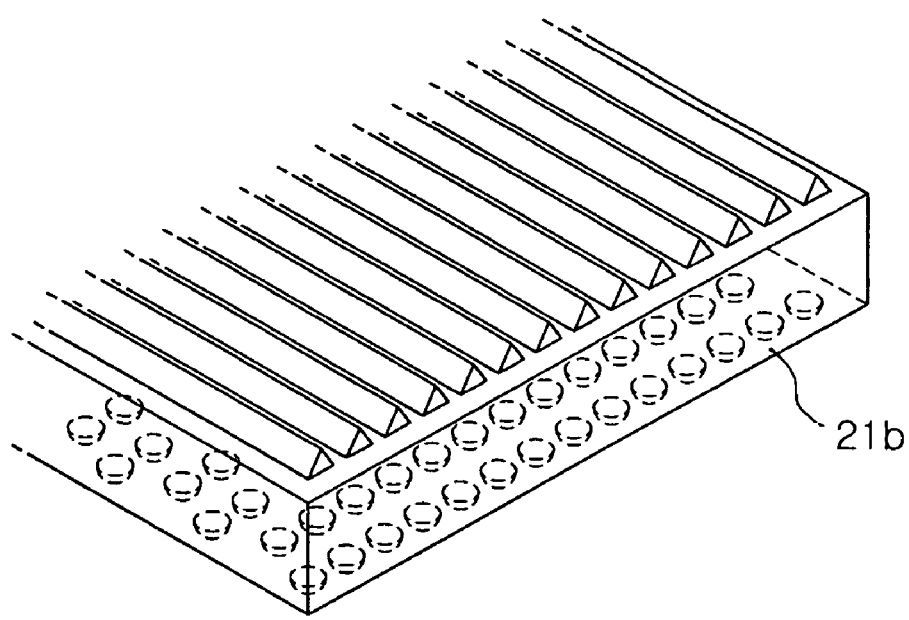

In another preferred embodiment of the present invention, the patterns formed on the first and second surfaces of the substrate 21 of the nitride semiconductor light emitting device may be modified. FIGS. 4A and 4B are views respectively illustrating the structures of other substrates applicable to the nitride semiconductor light emitting device according to the present invention shown in FIG. 2.

The nitride semiconductor light emitting device according to the present invention may have a substrate 21a as shown in FIG. 4A. Referring to FIG. 4A, the substrate 21a is provided at the upper and lower surfaces thereof with hemispherical convex patterns. Each of the hemispherical convex patterns has a plurality of convex parts, which are uniformly arranged at regular intervals. Preferably, the convex parts of the hemispherical convex patterns each have a height of approximately 1 to 5 μm, a diameter of approximately 3 to 5 μm. Also preferably, the distance between the respective convex parts of the hemispherical convex patterns is approximately 2 to 5 μm.

Also, the nitride semiconductor light emitting device according to the present invention may have another substrate 21a as shown in FIG. 4B. Referring to FIG. 4B, the substrate 21b is provided at a first surface thereof with a convex pattern having a plurality of prisms. The substrate 21b is provided at a second surface thereof with a hemispherical convex pattern having a plurality of convex parts, which are uniformly arranged at regular intervals. The emitting angle of light is directed in the vertical direction by means of the prism-shaped convex pattern, whereby light emitting efficiency is increased. Although not shown in the drawings, prism-shaped convex patterns may be formed on both surfaces of the substrate, respectively.

With the preferred embodiment of the present invention shown in FIGS. 4A and 4B, light inclination is easily changed such that the incident angle of light is reduced below the critical angle. Consequently, total reflection is decreased, and thus light emitting efficiency is improved.

The nitride semiconductor light emitting device with the above-stated construction is manufactured using a manufacturing method according to the present invention, which will be described hereinafter in detail.

Figure 6:
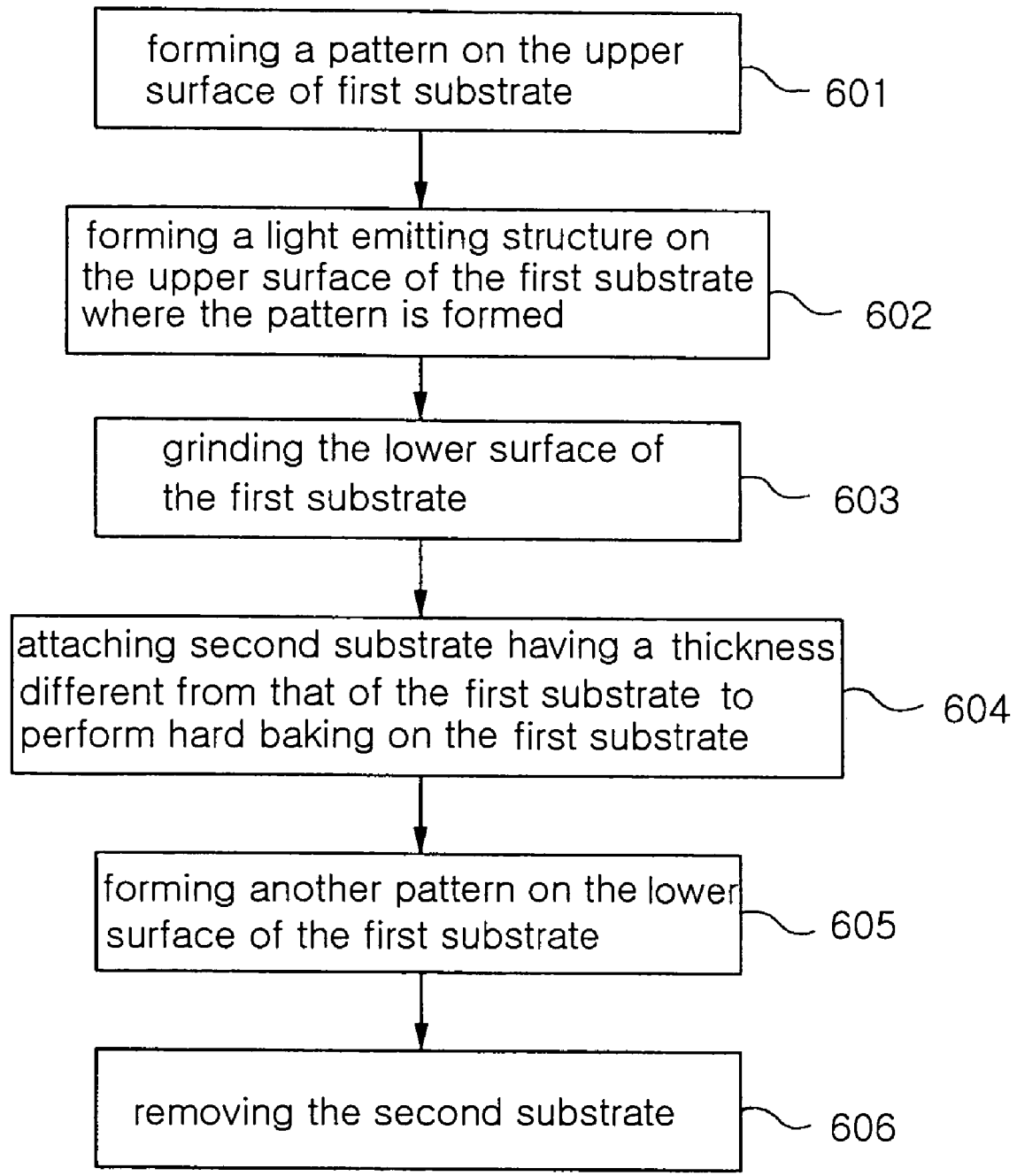
FIG. 6 is a flowchart illustrating a manufacturing process of the nitride semiconductor light emitting device according to the present invention.

FIG. 6 is a flowchart illustrating a manufacturing process of the nitride semiconductor light emitting device according to the present invention, and FIGS. 7A to 7H are views showing the steps of manufacturing the nitride semiconductor light emitting device according to the present invention.

The manufacturing process of the nitride semiconductor light emitting device according to the present invention will be described with reference to FIG. 6.

First, the convex pattern is formed on the first surface, i.e., the upper surface, of the substrate 21 that allows nitride semiconductor layers to be grown thereon (S601).

Next, a light emitting structure comprising the n-type nitride semiconductor layer 22, the active layer 23, and the p-type nitride semiconductor layer 24, which are disposed in sequence on the first surface of the substrate 21, is formed on the first surface of the substrate 21 having the convex pattern formed thereon, and the P-electrode 25 and the N-electrode 26 are formed on the first surface of the substrate 21 (S602). After the second surface of the substrate 32 is ground, the N-electrode 26 and the P-electrode 27 are attached to a jig substrate such that the substrate is leveled so as to form the concave pattern on the second surface of the substrate 21 (S603).

The concave pattern is formed on the second surface, i.e., the lower surface, of the leveled substrate 21 (S604), and the jig substrate is removed (S605). In this way, the nitride semiconductor light emitting device according to the present invention as shown in FIG. 2 is manufactured.

The manufacturing steps of the nitride semiconductor light emitting device shown in FIG. 2 will be described in more detail with reference to FIGS. 7A to 7H.

Figure 7A:
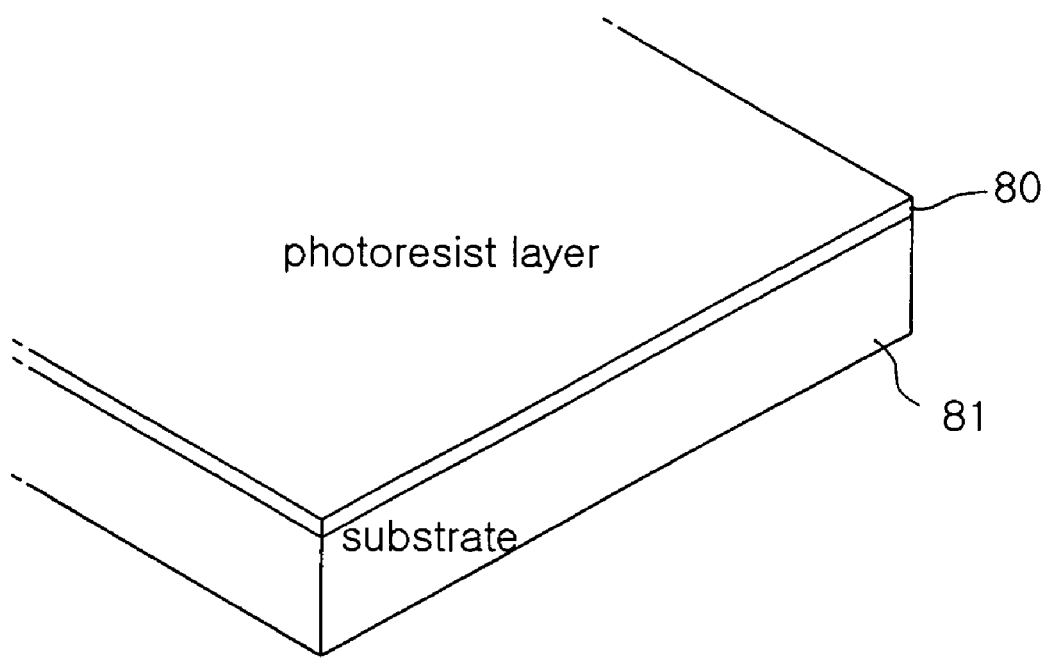
FIGS. 7A to 7H are views showing the steps of manufacturing the nitride semiconductor light emitting device according to the present invention.
Figure 7B:
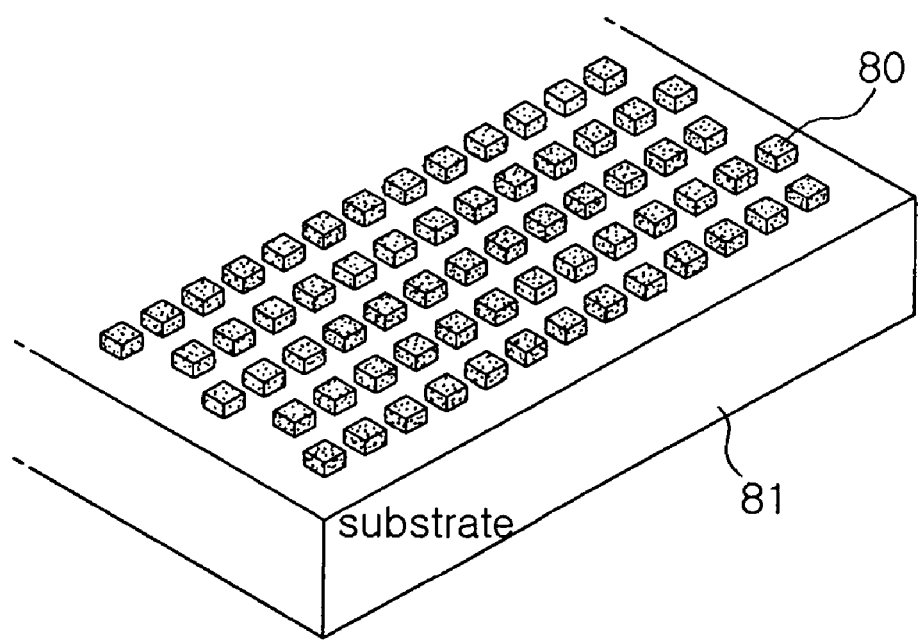
Figure 7C:
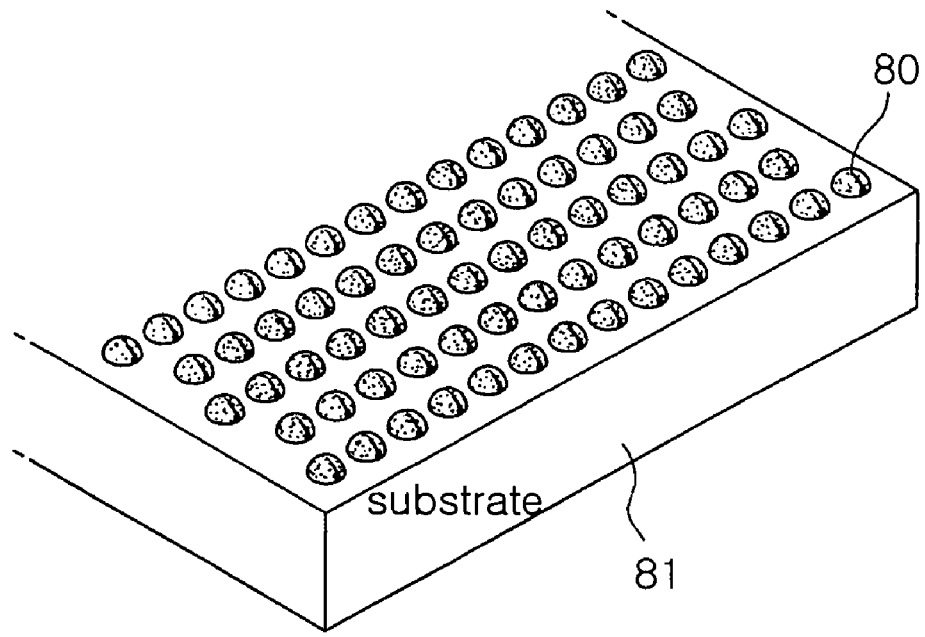

At the step of forming a convex pattern on the first surface of a substrate 81 (S601), a photoresist 80 having a predetermined thickness is applied to the first surface of the substrate 81, which allows a light emitting structure to be grown thereon, as shown in FIG. 7A. For example, the thickness of the photoresist 80 is approximately 3 to 5 μm, which is slightly greater than that of a hemispherical convex pattern to be formed on the first surface of the substrate 81. Subsequently, the photoresist 80 is processed by means of a photo process such that the photoresist 80 has a predetermined hexahedral pattern having a plurality of hexahedral parts uniformly arranged at regular internals as shown in FIG. 7B. Preferably, the hexahedral parts of the hexahedral pattern formed on the first surface of the substrate 81 each have a height greater than that of each of convex parts of a hemispherical convex pattern to be formed on the first surface of the substrate 81, and a diameter less than that of each of the convex parts of the hemispherical convex pattern. Also, the distance between the respective hexahedral parts of the hexahedral pattern is preferably greater than that between the respective convex parts of the convex pattern. After that, the photoresist 80 is subjected to re-flow at a temperature of 100 to 150° C. for 1 to 5 minutes. As a result of the re-flow, the photoresist is transformed into the hemispherical shapes as shown in FIG. 7C.

Figure 7D:
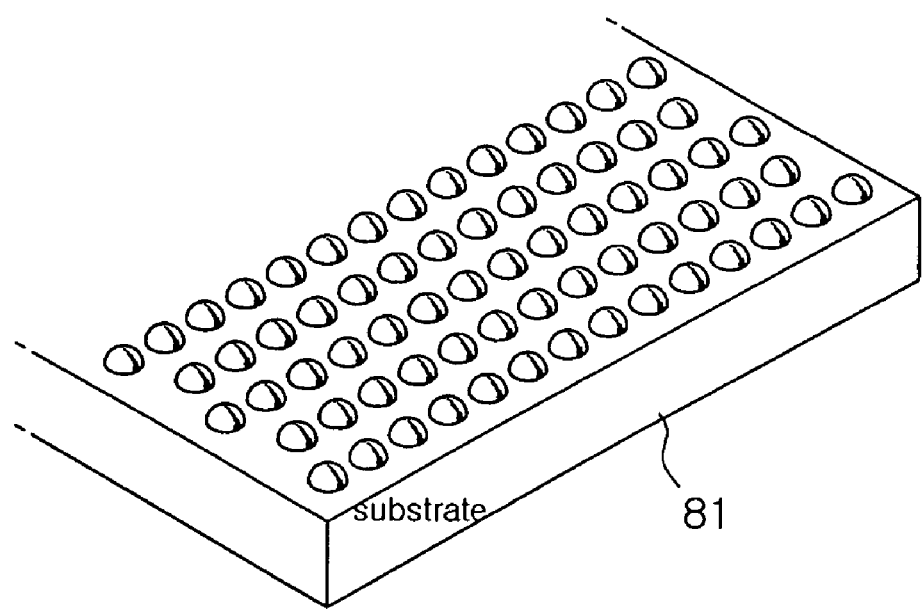

Inductively coupled plasma reactive ion etching (hereinafter, referred to as ICP-RIE) is performed on the first surface of the substrate 81 using the hemispherical photoresist 80 formed as described above as a mask such that the first surface of the substrate 81 is etched to a depth in inverse proportion to the thickness of the hemispherical photoresist 80. As a result, a hemispherical convex pattern is formed on the first surface of the substrate 81 as shown in FIG. 7D. The hemispherical convex pattern almost corresponds to the hemispherical pattern of the photoresist 80. In the ICP-RIE process, $BCl_3$ and HBr are used as etching gases.

The manufacturing process shown in FIGS. 7A to 7D can be applied to Step S606 of FIG. 6 when the hemispherical convex pattern is formed on the second surface of the substrate 21a or 21b as shown in FIGS. 4A to 4B.

Figure 7E:
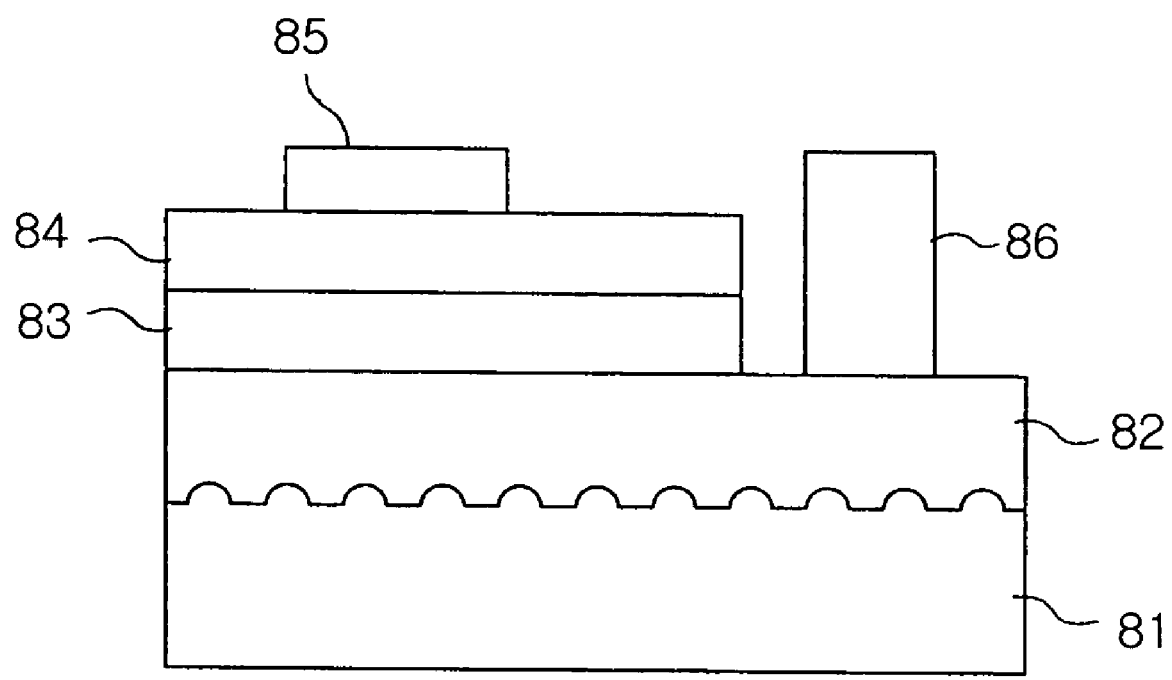

At Step S602, an n-type nitride semiconductor layer 82, an active layer 83, a p-type nitride semiconductor layer 84, a P-electrode 85, and an N-electrode 86 are formed in sequence on the first surface of the substrate 81, where the hemispherical convex pattern is formed, as shown in FIG. 7E.

After the light emitting structure is formed as described above, the second surface of the substrate 81 is ground to form a convex or concave pattern at Step S603. At this time, the substrate 81 may be bent due to the difference of thermal stress between the substrate 81 and the nitride semiconductor. Consequently, it is necessary to level the substrate 81.

Figure 7F:
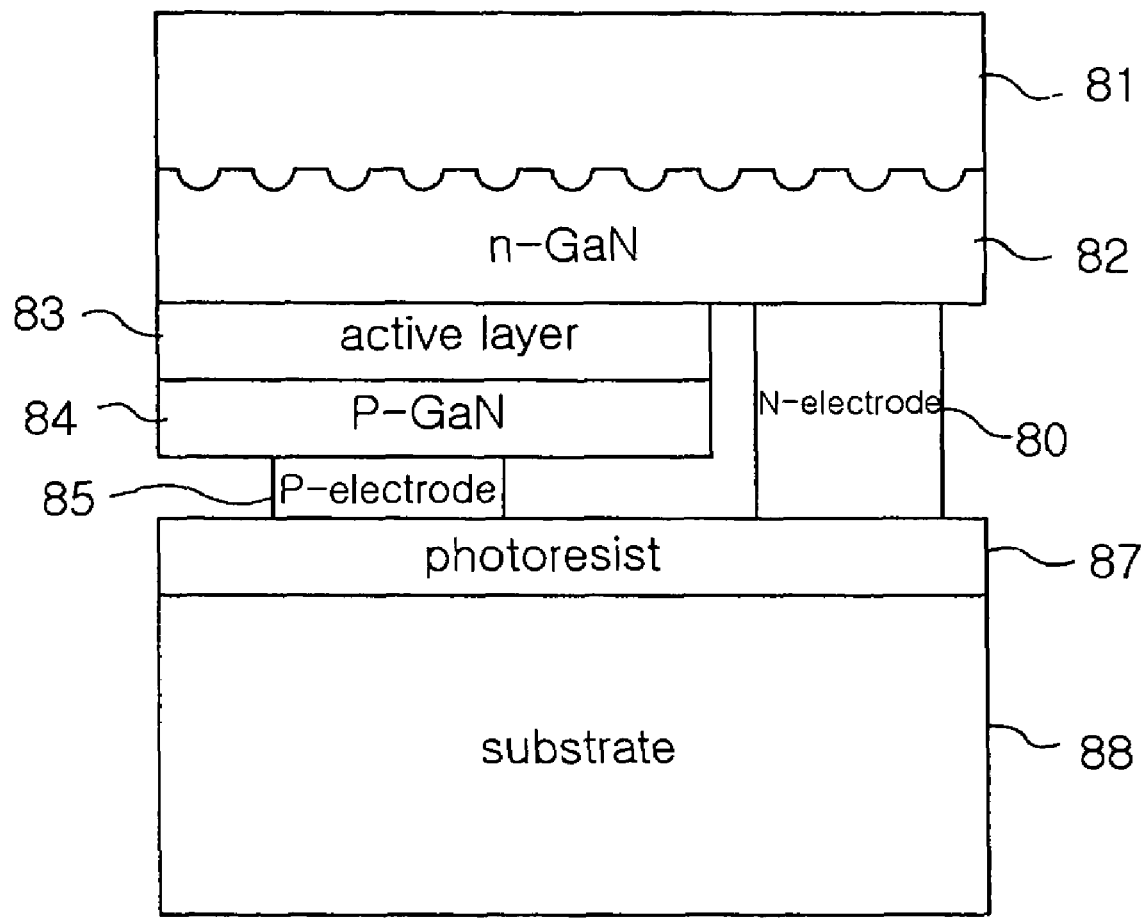
Figure 7G:
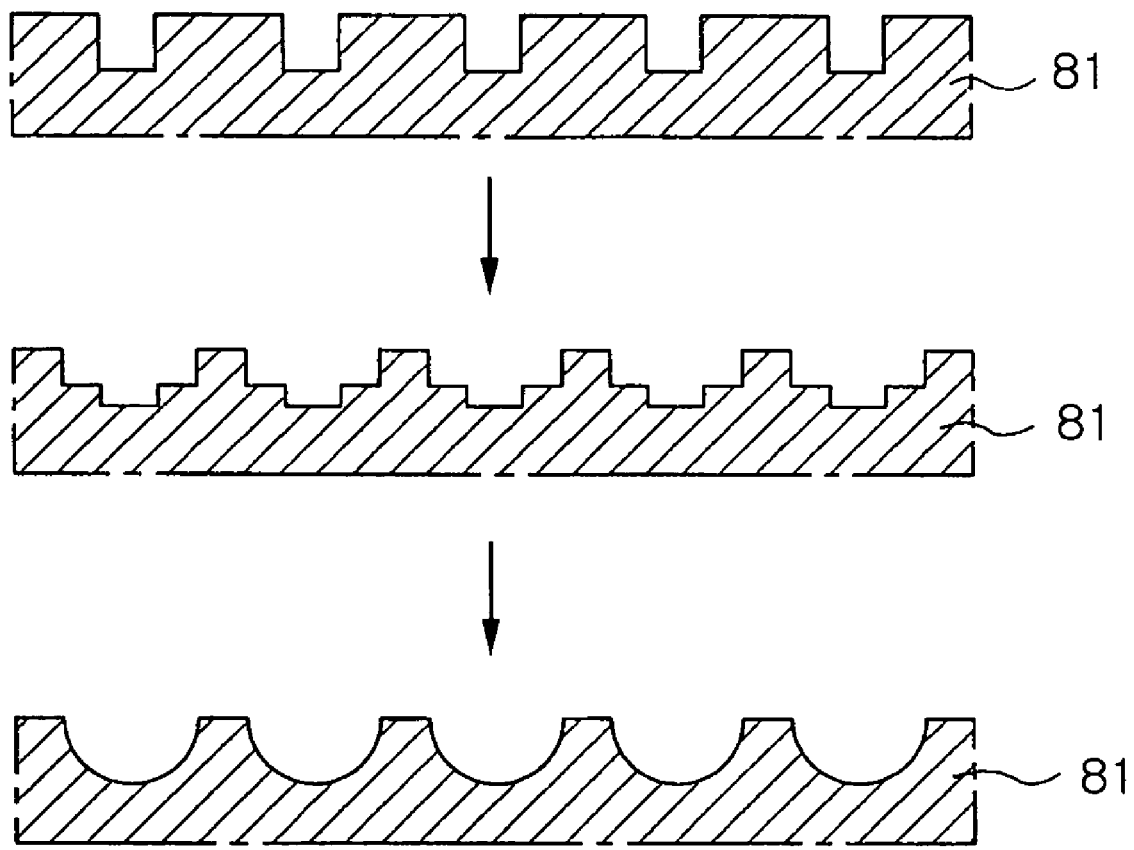

To this end, at Step 604, the P-electrode 85 and the N-electrode 86 of the substrate 81 having the light emitting structure formed thereon are attached to a jig substrate 88 having a photoresist or polymer 87 applied thereto, and then hard baking is carried out such that the substrate 81 can be leveled by means of the jig substrate as shown in FIG. 7F. At this time, a sapphire substrate or an Si substrate having a thickness different from that of the substrate 81 of the light emitting device may be used as the jig substrate 88.

Figure 7H:
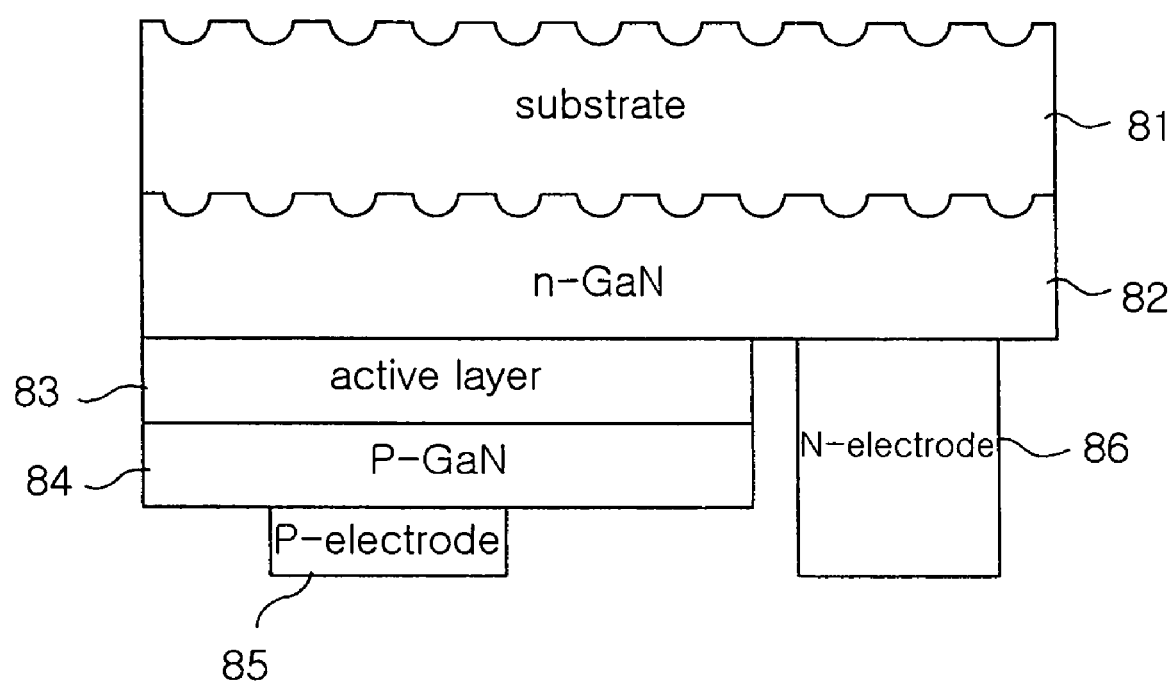

At Step S606 of forming a predetermined pattern on the second surface of the substrate, the manufacturing process of FIGS. 7A to 7D is carried out when the pattern to be formed is the hemispherical convex pattern as shown in FIG. 4A. When the pattern to be formed is the hemispherical concave pattern as shown in FIG. 2, on the other hand, the manufacturing process is carried out as follows:

As shown in FIG. 7F, a first circular concave pattern having a plurality of concave parts is formed on the second surface, which is ground, of the substrate 81 attached to the jig substrate 88. The concave parts are arranged at regular intervals, each of the concave parts having a first diameter. The first diameter of each of the concave parts is small, for example, approximately 1 to 2 μm. Subsequently, the second surface of the substrate 81 is etched by means of the ICP-RIE process. At this time, a second circular concave pattern having a plurality of concave parts is formed on the second surface of the substrate 81. The concave parts of the second circular concave pattern overlap with the concave parts of the first circular concave pattern, respectively. Each of the concave parts of the second circular concave pattern has a second diameter, which is greater than the first diameter of each of concave parts of the first circular concave pattern. As a result, a stepped concave pattern is formed on the second surface of the substrate 81. After that, the concave parts of the first and second concave patterns are over-etched again to obtain a hemispherical concave pattern. The final state of the second surface of the substrate 81, to which the above-described processes are applied, is shown in FIG. 7H.

After the pattern has been formed on the second surface of the substrate 81 as described above, the photoresist is removed to separate the jig substrate 88 from the substrate 81. In this way, the nitride semiconductor light emitting device according to the present invention is manufactured.

In order to confirm how much the characteristics of the present invention are improved, light efficiencies were experimentally tested for a conventional flip chip light emitting device (hereinafter, referred to as "comparative example"), a light emitting device according to a preferred embodiment of the present invention having a hemispherical convex pattern formed on the first surface of the substrate 21 (hereinafter, referred to as "first inventive example"), and another light emitting device according to another preferred embodiment of the present invention having hemispherical convex and concave patterns formed on the first and second surfaces of the substrate 21 (hereinafter, referred to as "second inventive example"), as shown in FIG. 2. The height of each of the hemispherical convex or concave parts of the hemispherical patterns was approximately 1.5 μm, and the diameter of each of the hemispherical convex or concave parts was 3 μm. The distance between the respective convex or concave parts of the hemispherical convex or concave patterns was 3 μm. Other conditions were the same for all examples.

The number of photons generated by the respective structures and the rate at which photons were generated are indicated in Table 1.

TABLE 1

|  | Comparative example | First inventive example | Second inventive example |
| --- | --- | --- | --- |
| Number of photons | 27,798 | 58,375 | 72,275 |
| Rate | 1 | 2.1 | 2.6 |

It can be seen from Table 1 that the number of photons obtained from the first inventive example, i.e., the light emitting device having the hemispherical convex pattern formed on the first surface of the substrate is approximately two times that of the comparative example, i.e., the conventional flip chip light emitting device, and the number of photons obtained from the second inventive example, i.e., the light emitting device having the hemispherical convex and concave patterns formed on the first and second surfaces of the substrate is approximately 2.6 times that of the comparative example, i.e., the conventional flip chip light emitting device. Consequently, it can be seen that the second inventive example has the highest light emitting efficiency.

As apparent from the above description, the nitride semiconductor device according to the present invention reduces internal total reflection of the device. Consequently, the present invention has the effect of increasing the service life of the device while increasing the amount of light generated, and thus improving the characteristics of the device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A nitride semiconductor light emitting device comprising:
   a substrate having upper and lower surfaces;
   a n-type nitride semiconductor layer formed on the upper surface of the substrate;
   an active layer formed on the upper surface of the n-type nitride semiconductor layer such that the n-type nitride semiconductor layer is partially exposed;
   a p-type nitride semiconductor layer formed on the upper surface of the active layer;
   a p-electrode formed on an upper surface of the p-type nitride semiconductor layer; and
   a n-side electrode formed on the partially exposed n-type nitride semiconductor layer;
   wherein the lower surface of the substrate comprises a regular pattern of hemispherical cavities for reducing total internal reflection at an interface between said lower surface of the substrate and an environment outside said device; and
   wherein the upper surface of the substrate comprises a regular pattern of hemispherical raised projections for reducing total internal reflection at an interface between said upper surface of the substrate and the n-type nitride semiconductor layer formed thereon.

2. The device as set forth in claim 1, wherein said upper surface of the substrate is a continuous plane, which completely surrounds all said raised projections or cavities.

3. The device as set forth in claim 1, wherein said lower surface of the substrate is a continuous plane, which completely surrounds all said raised projections or cavities.

4. A nitride semiconductor light emitting device comprising:
   a substrate having upper and lower surfaces;
   a n-type nitride semiconductor layer formed on the upper surface of the substrate;
   an active layer formed on the upper surface of the n-type nitride semiconductor layer such that the n-type nitride semiconductor layer is partially exposed;
   a p-type nitride semiconductor layer formed on the upper surface of the active layer;
   a p-electrode formed on an upper surface of the p-type nitride semiconductor layer;
   a n-side electrode formed on the partially exposed n-type nitride semiconductor layer; and
   wherein the lower surface of the substrate comprises a plurality of raised projections or cavities of a predetermined shape for changing light inclination at the lower surface of the substrate to reduce total internal reflection at an interface between said lower surface of the substrate and an environment outside said device; and
   wherein the upper surface of the substrate comprises a plurality of raised projections or cavities of a predetermined shape for changing light inclination at the upper surface of the substrate to reduce total internal reflection at an interface between said upper surface of the substrate and the n-type nitride semiconductor layer formed thereon.

5. The device as set forth in claim 4, wherein said raised projections are hemispherical in shape.

6. The device as set forth in claim 4, wherein said cavities are hemispherical in shape.

7. The device as set forth in claim 4, wherein said raised projections are parallel prism-shaped stripes.

8. The device as set forth in claim 4, wherein said cavities are parallel prism-shaped stripes.

9. The device as set forth in claim 4, wherein said raised projections or cavities are uniformly arranged at regular interval.

10. The device as set forth in claim 4, wherein said upper surface of the substrate is a continuous plane, which completely surrounds all said raised projections or cavities.

11. The device as set forth in claim 4, wherein said lower surface of the substrate is a continuous plane, which completely surrounds all said raised projections or cavities.

12. The device as set forth in claim 4, wherein said predetermined shape satisfies the following equation:
$\alpha_0 = \sin^{-1}(n_2/n_1)$; where $\alpha_0$ is the minimum value of the incident angle where total reflection of light occurs; $n_1$ is the light refractive index of said n-type nitride semiconductor layer; and $n_2$ is the light refractive index of said substrate.

* * * * *